US010312949B2

(12) United States Patent
Chaplet et al.

(10) Patent No.: US 10,312,949 B2
(45) Date of Patent: Jun. 4, 2019

(54) MODULAR BASE STATION ARCHITECTURE FOR WIRELESS SENSOR NETWORK

(71) Applicant: KERLINK, Thorigne-Fouillard (FR)

(72) Inventors: Martin Chaplet, Thorigne-Fouillard (FR); Michel Gilbert, Chateaugiron (FR); Samuel Nicolas, Cesson Sevigne (FR); Ronan Dubourg, Noyal sur Vilaine (FR); Yannick Delibie, Thorigne-Fouillard (FR)

(73) Assignee: KERLINK, Thorigne-Fouillard (FR)

( * ) Notice: Subject to any disclaimer, the term of this patent is extended or adjusted under 35 U.S.C. 154(b) by 0 days.

(21) Appl. No.: 15/754,509

(22) PCT Filed: Aug. 30, 2016

(86) PCT No.: PCT/FR2016/052152
§ 371 (c)(1),
(2) Date: Feb. 22, 2018

(87) PCT Pub. No.: WO2017/037381
PCT Pub. Date: Mar. 9, 2017

(65) Prior Publication Data
US 2018/0248568 A1    Aug. 30, 2018

(30) Foreign Application Priority Data
Aug. 31, 2015   (FR) ...................................... 15 58081

(51) Int. Cl.
H04B 1/00    (2006.01)
H04L 12/28   (2006.01)
(Continued)

(52) U.S. Cl.
CPC ............. *H04B 1/0003* (2013.01); *G06F 1/18* (2013.01); *H04B 1/005* (2013.01); *H04B 1/3816* (2013.01);
(Continued)

(58) Field of Classification Search
CPC combination set(s) only.
See application file for complete search history.

(56) References Cited

U.S. PATENT DOCUMENTS

| 6,741,466 B1 | 5/2004 | Lebo | |
|---|---|---|---|
| 2010/0265398 A1* | 10/2010 | Johnson | H04H 20/30 348/500 |

(Continued)

FOREIGN PATENT DOCUMENTS

| EP | 2216909 A2 | 8/2010 |
|---|---|---|
| WO | 0228158 A1 | 4/2002 |
| WO | 2013138360 A1 | 9/2013 |

OTHER PUBLICATIONS

International Search Report for corresponding PCT application No. PCT/FR2016/052152, dated Nov. 16, 2016.

*Primary Examiner* — Andrew Wendell
(74) *Attorney, Agent, or Firm* — Notaro, Michalos & Zaccaria P.C.

(57) ABSTRACT

A gateway architecture able to meet the challenges raised by the large-scale deployment of wireless sensor networks. The main modules within such a gateway for wireless sensor networks, for example digital radio modems and analog radio interface modules take the form of various separate physical blocks that may be joined together. This technique makes it possible to implement adaptable and scalable modular gateways that may be quickly and easily configured or suited to any situation, simply by replacing existing physical blocks or adding new physical blocks.

15 Claims, 6 Drawing Sheets

(51) Int. Cl.
  *H04B 1/3816* (2015.01)
  *H05K 5/00* (2006.01)
  *G06F 1/18* (2006.01)
  *H04B 7/24* (2006.01)
  *H04W 88/16* (2009.01)
  *H04W 84/18* (2009.01)

(52) U.S. Cl.
  CPC .............. *H04B 7/24* (2013.01); *H04W 88/16* (2013.01); *H05K 5/0021* (2013.01); *H04W 84/18* (2013.01)

(56) References Cited

U.S. PATENT DOCUMENTS

| | | | |
|---|---|---|---|
| 2012/0054389 A1* | 3/2012 | Lee | G06F 13/4036 |
| | | | 710/106 |
| 2012/0189069 A1* | 7/2012 | Iannuzzelli | H04H 20/30 |
| | | | 375/259 |
| 2013/0077966 A1* | 3/2013 | Gelbman | H04B 10/25753 |
| | | | 398/43 |
| 2014/0024413 A1 | 1/2014 | Sun | |
| 2014/0350768 A1 | 11/2014 | Filippov et al. | |
| 2018/0062704 A1* | 3/2018 | Singh | H01F 38/14 |

\* cited by examiner

MODULAR BASE STATION ARCHITECTURE FOR WIRELESS SENSOR NETWORK

1. FIELD

The field of the invention is that of the Internet of Things. More specifically, the invention relates to a gateway architecture which permits the deployment of wireless sensor networks, specifically on a large scale, and to the interconnection of such networks with other networks such as, for example, the Internet.

2. PRIOR ART

The Internet of Things is developing rapidly. This development is accompanied by the emergence of new applications, which extend beyond the traditional scope of homes or businesses and are integrated in far larger infrastructures. Specifically, the concept of "smart cities" falls within the context of this development. By the large-scale deployment of wireless sensor networks, or other communicating objects, it becomes possible to offer new services to individuals, or to the authorities responsible for municipal administration. The range of possibilities is extensive. In this way, street lighting can be optimized, for example by the adaptation thereof to road traffic conditions at any given time. Parking management can also be facilitated, by the real-time notification of drivers of available parking spaces using sensors which are integrated in each parking space. This contributes, for example, to the reduction of vehicle fuel consumption, and consequently to the reduction of pollution.

The deployment of these wireless sensor networks represents a particularly attractive development opportunity for mobile telephone operators. In practice, the latter are ideally positioned: firstly, they have developed expertise in the field of the deployment of large-scale wireless networks, and secondly they already have a proportion of the requisite infrastructures for the deployment of such a network in place. For example, installation sites (masts, posts, high points, etc.) for the relay antennae used in mobile telephony can also be employed for the accommodation of antennae and base stations which are deployed for the operation of a wireless sensor network. The function of these base stations is the reception and transmission of data from and to wireless sensors which are present within their zone of coverage (radio access), but also the relaying of these data to facilities for the processing thereof, for example servers which are accessible on an IP-based network (IP: "Internet Protocol"). Base stations also fulfill an interfacing role between the wireless sensor network and other networks, for example a wide-area network such as the Internet, and, accordingly, are also described as "gateways".

A number of radio access technologies are available for the deployment of wireless sensor networks. By way of illustration only, and not by way of limitation, mention may be made of LoRa™, Sigfox™ or WM-bus ("Wireless Meter Bus") technologies, which are specifically based upon different types of modulation. These technologies can operate in different radio frequency bands (for example in private frequency bands, subject to the acquisition of a license; or in unrestricted frequency bands, such as ISM bands), using a wide variety of types of antennae (sectorized, polarized, omnidirectional, etc.). Accordingly, there are a multitude of potential configurations, and the determination of the technical solution to be preferred generally results from the appraisal of numerous criteria. Thus, the topography of the zone of deployment, the density of sensors to be addressed, and the targeted quality of service, together with regulations in force in the territory considered (unrestricted frequency bands differ, for example, between the USA and France) are all factors, among many others, to be considered in the deployment of a wireless sensor network.

Existing gateways for the deployment of wireless sensor networks have limited scalability: in general, they are designed for the management of a single type of radio access technology, in a single radio frequency band. These gateways generally provide only limited connectivity, in terms of potential configurations of antennae, or may even dictate the use of the antenna supplied. Finally, in the majority of cases, they can manage only a single type of interface (hard-wired, or WiFi, or 3G/4G, for example) with another network (such as the Internet, for example). While these gateways are particularly appropriate for the deployment of wireless sensor networks on a small or medium scale—in contexts of application which are relatively fixed and closely-managed—they are no longer suitable for the deployment of wireless sensor networks over very extensive and constantly changing zones—for example on the scale of an entire city—where a high degree of responsiveness and adaptability are required. These existing gateways, which must be entirely replaced in response to the slightest requirement for a network upgrade, are therefore unable to accommodate the various issues associated with the scheduled expansion of dedicated networks for the Internet of Things: a constant and substantial increase in the number of sensors to be managed within a single territory, the diversity of radio access technologies to be accommodated, the diversity of frequency bands used, the diversity of types of antennae to be managed, etc.

There is thus a requirement for a new type of gateway for wireless sensor networks or other communicating objects which provides sufficient adaptability to permit the suppliers of solutions for the large-scale Internet of Things to upgrade a network already deployed in a simple and rapid manner, at a moderate cost; there is also a need for the straightforward transposition of a solution from one territory to another, notwithstanding the differences (topographic, regulatory, etc.) which may exist between these territories, in order to provide an easier response to the dictates and expectations of these new territories.

3. SUMMARY

The proposed technique offers a solution which eliminates at least some of these problems from the prior art, by means of a modular gateway architecture for a wireless sensor network.

According to a first aspect, the proposed technique relates to a digital radio modem for the modulation and demodulation of a digital signal, in accordance with a preselected radio access technology, wherein said digital radio modem is characterized in that it comprises a protective frame and a plurality of communication interfaces which are arranged within said frame.

Thus, the digital radio modem according to the proposed technique is not integrated, for example, in a printed circuit: it has its own dedicated frame, within which different communication interfaces are arranged. In this manner, the digital radio modem provides a degree of flexibility in use: it constitutes an independent physical unit, which can easily be assembled or disassembled in conjunction with the deployment of a gateway for a wireless sensor network.

In a particular form of embodiment of the proposed technique, said plurality of communication interfaces comprises at least a first communication interface with a complementary device, and at least a second communication interface with an analog radio interface module.

The digital radio modem thus has at least two communication interfaces.

The first communication interface permits the connection thereof to a complementary device, which may be a device of the same type (namely, another digital radio modem according to the proposed technique) or a device of another type (for example a control device, an electric power supply device, or a device for the management of the connection with another communication network). In the first case, the digital radio modems are mutually connected by the cooperation of the respective first communication interfaces of said devices. In the second case, the complementary device to which the digital radio modem according to the proposed technique is connected itself comprises at least one communication interface which permits the cooperation thereof with said at least one first communication interface on the digital radio modem. This first communication interface assumes, for example, the form of an SPI ("Serial Peripheral Interface") connector. In this manner, devices thus connected share at least one common data bus.

The second communication interface permits the connection of the digital radio modem to an analog radio interface module. In this manner, by the combination of these two independent physical blocks, it is possible to constitute a radio interface device which, by the addition of an antenna, permits the reception and transmission of data from or to at least one remote sensor. This second communication interface can also assume the form of an SPI ("Serial Peripheral Interface">>) connector, thus permitting the constitution of a data bus between these two elements, once they are mutually connected.

In another particular form of embodiment of the proposed technique, the digital radio modem comprises at least two first communication interfaces with a complementary device, wherein these communication interfaces constitute the terminations of at least one data bus employed by said digital radio modem for the transmission and/or reception of data to and/or from at least one complementary device.

In this manner, due to the presence of these at least two first communication interfaces, it is possible to interconnect a number of digital radio modems according to the proposed technology, but also to interconnect the latter with compatible complementary devices of other types, such that all the devices thus connected share at least one common data bus.

In a further particular form of embodiment of the proposed technique, the digital radio modem is characterized in that said preselected radio access technology is included in the group comprising the following:

LoRa™ technology;
Sigfox™ technology;
WM-BUS technology.

Thus, the digital radio modem according to the proposed technique is particularly appropriate in the context of the development of the Internet of Things, i.e. for the deployment of wireless communication networks based upon optimized communication protocols for the minimization of the electrical consumption of sensors and other communicating objects employed.

In another particular form of embodiment of the proposed technique, this preselected radio access technology is selected from a series of predefined radio access technologies within said digital radio modem.

In this manner, a single digital radio modem can accommodate different radio access technologies, and can thus be employed differently in different contexts by means of a simple configuration step. Specifically, this permits the optimization of manufacturing costs, and facilitates the installation of these devices.

According to a second aspect, the proposed technique relates to an analog radio interface module, which comprises a protective frame, connection means to at least one antenna, and at least one third communication interface with a digital radio modem as described above, wherein said connection means to at least one antenna and said at least one third communication interface are arranged within said frame.

Thus, the analog radio interface module is not integrated, for example, in a printed circuit: it has a dedicated frame, within which at least one communication interface with a digital radio modem according to the proposed technique is arranged. In this manner, the analog radio interface module according to the proposed technique constitutes an independent physical block, thus providing a manifest degree of flexibility in its use: it can easily be disconnected and reconnected to one or more digital radio modems. It further comprises connection means to at least one antenna, thereby rendering it suitable for the management of different antennae configurations.

According to a further aspect, the proposed technique relates to a radio interface device for the reception and transmission of data from and to at least one wireless sensor, which comprises at least one digital radio modem of the type described above, and an analog radio interface module of the type described above. The analog radio interface module is connected to said at least one digital radio modem by the cooperation of the second and third communication interfaces thereof.

In this manner, it is possible to constitute a radio interface device by the combination of one or more digital radio modems of the same type (employing the same radio access technology) with an analog radio interface module according to the proposed technique. The fact that these different physical blocks each has a dedicated frame, comprising complementary communication interfaces, provides a solution with a high degree of modularity. It is thus possible to achieve a very simple adaptation to a large number of situations, by the simple choice of one type of digital radio modem and one type of analog radio interface module to be combined. Selection of the type of digital radio modem thus permits the definition of the radio access technology to be employed (depending upon the functionalities provided by this digital radio modem, a simple software configuration may be sufficient). Selection of the type of analog radio interface module permits the definition, firstly of the frequency band which is to be employed for radio transmission, and secondly of the antennae configuration typology to be used (sectorized, polarized or omnidirectional antenna, etc.).

In a particular form of embodiment, a radio interface device of this type comprises a plurality of digital radio modems according to the proposed technique, associated with the same radio access technology, wherein the digital radio modems constituting said plurality of digital radio modems are mutually connected by means of their first communication interfaces.

It is thus possible to undertake the easy mutual connection of a plurality of digital radio modems of the same type according to the proposed technique, and to associate the combination thus formed with a single analog radio interface module. In this manner, it is possible to increase the load capacity of a radio interface device, by the simple addition of a supplementary digital radio modem to the existing installation: the solution according to the proposed technique thus permits, for example, a very simple response to an expansion in the number of wireless sensors to be managed within a given territory, under the coverage of a single antenna.

According to a further aspect, the proposed technique relates to a gateway for the interconnection of at least one wireless sensor network with at least one wide-area communication network, wherein said gateway is characterized in that it comprises:

- at least one radio interface device according to the proposed technique;
- at least one complementary interface device with said at least one wide-area communication network, wherein said complementary device comprises at least a fourth communication interface, wherein said complementary device is connected to said at least one radio interface device by means of the cooperation of said fourth communication interface with a first communication interface on a digital radio modem of said radio interface device.

In this manner, it is possible to construct a gateway which permits the interconnection of at least one wireless sensor network with at least one other wide-area communication network, by the simple combination of radio interface devices (themselves obtained by the simple combination of digital radio modems with analog radio interface modules), wherein at least one compatible complementary device manages access to the wide-area network. The communication interfaces which are simultaneously present on the complementary devices and on the digital radio modems which are incorporated within the radio interface devices permit the interconnection of all these elements, by the constitution of a common data bus, for example of the SPI type. Other types of complementary devices, also provided with compatible communication interfaces, can also permit access to this shared data bus, thereby finalizing the constitution of the gateway: by way of an example, reference may be made to a complementary device for the delivery of an electric power supply to the entire gateway, or a complementary control device for the monitoring of the operation of all the other complementary devices and radio interface devices included in the gateway, and for the control of data exchanges executed between all these different elements.

In a particular form of embodiment, a gateway of this type comprises a plurality of radio interface devices according to the proposed technique, wherein said radio interface devices of said plurality of radio interface devices are mutually connected by means of the cooperation of the first communication interfaces of the digital radio modems of said plurality of radio interface devices.

Thus, a first gateway can comprise a string of a plurality of radio interface devices according to the proposed technique, and thus be adaptable to an even greater number of situations. In this manner, for example, it is possible to combine radio interface devices based upon heterogeneous radio access technologies in a single gateway. This flexibility of connection also permits the constitution of a gateway which is capable of managing several different frequency bands. This also permits the deployment of sectorization, for example, in the interests of superior territorial coverage. Naturally, all these examples are provided exclusively by way of illustration, and not by way of limitation, and a person skilled in the art will be aware of the multiple configuration options provided by a gateway which is constituted according to the proposed technique.

The different forms of embodiment described above are mutually combinable for the deployment of the invention.

4. LIST OF FIGURES

Further characteristics and advantages of the invention will be clarified by the following description of a preferred form of embodiment of the invention, which is provided by way of illustration only and not by way of limitation, and by the attached drawings, in which.

5. DETAILED DESCRIPTION

The proposed technique relates to a novel base station architecture for the deployment of sensor networks, or other communicating objects, in a wireless arrangement. Throughout the document, a base station of this type is also described as a "gateway", and the term "wireless sensor network" is employed indiscriminately to signify a network of wireless sensors, or a network of—potentially more complex—wireless communication objects. The proposed architecture is based upon the separation of the key conventional functionalities of a gateway into different physical blocks, each of which has its own dedicated frame, within which different communication interfaces are arranged, such that these different physical blocks are interconnectable. This design not only permits the simple and rapid construction of "customized" gateways, thus permitting the fulfillment of many different types of requirements, but also endows these gateways with a high level of modularity and scalability. The proposed architecture permits the highly straightforward replacement of one physical block by another, or the addition of a further physical block to a gateway already constituted. To this end, this architecture is particularly appropriate for the deployment of large-scale wireless sensor networks (although it can also be employed in the context of the deployment of wireless sensor networks on a smaller scale).

5.1. Description of the Constituent Elements of a Gateway

Figure 1:
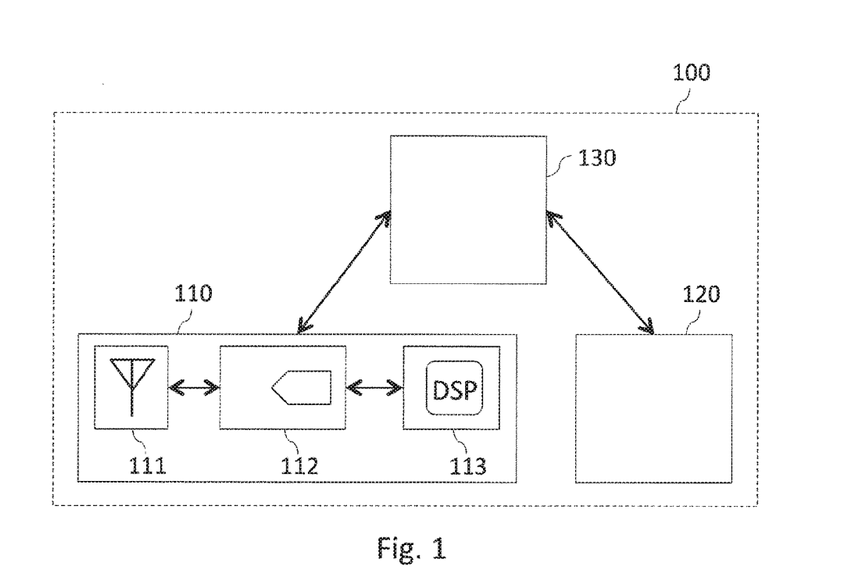
FIG. 1 shows a simplified view of the main modules in a gateway for the deployment of a wireless sensor network.

With reference to FIG. 1, a simplified schematic view is represented of the main modules deployed in a gateway for a wireless sensor network. A gateway (100) of this type comprises:

a first interface module (110) with the wireless sensor network;

at least one second interface module (120) with another network, for example a local IP network, or a wide-area network such as the Internet;

a control module (130), which is designed to control the abovementioned interface modules.

The first interface module (110) with the wireless sensor network constitutes the radio access device of the gateway. It is designed to execute data exchanges between the gateway and the wireless sensors, via a radio transmission channel. It comprises the following main sub-modules:

an antenna (111), which is designed to radiate or capture radio waves for the conveyance of data to be exchanged;

an analog radio interface module (112), which constitutes the front-end analog radio frequency system, responsible for the execution of processing functions on the analog signal delivered by or supplied to the antenna, in the frequency band which is employed for radio transmission (these processing functions may involve filtering, frequency transposition, power amplification, etc.); the analog radio interface module also executes analog-to-digital conversion functions (upon the reception of data from sensors) and digital-to-analog conversion functions (upon the transmission of data to sensors);

a digital radio modem (113) which specifically permits the modulation and demodulation of digital signals, according to the radio access technology employed, for example by means of a digital signal processor (DSP).

In the majority of existing gateways for wireless sensor networks, these elements are generally embodied by electronic circuits which are present on the same electronic circuit board, or are at least integrated in the same frame (with the exception of the antenna, which is either secured to said frame, or is connected to said frame by means of a dedicated connector arranged within said frame). This advanced integration is such that these gateways are appropriate for the fulfillment of highly specific requirements (for the use of a given radio access technology, within a given frequency band), but do not fulfill the requirements for adaptability and scalability associated with the deployment of large-scale wireless sensor networks.

5.2. General Principle of the Proposed Technique

The technique described here endeavors to at least partly rectify this problem, firstly by the physical separation, in separate frames (or housings) of the analog module (i.e. the analog radio interface module which constitutes the front-end analog system) and the digital module (i.e. the digital radio modem) of a radio interface device; and secondly by the deployment of means for the simple connection of a plurality of radio interface devices, not only to one another, but also to complementary devices such as control devices or interface devices with a wide-area network. The general principle of the proposed technique therefore involves the isolation of the main modules deployed in a gateway for a wireless sensor network into independent physical blocks, which can be mutually combined. By this technique, it is therefore possible to deploy modular and scalable gateways for wireless sensor networks, which can be rapidly and easily configured or adapted to respond to any type of situation, by the simple replacement of existing physical blocks or the addition of new physical blocks.

5.3. Digital Radio Modem

To this end, a device for the modulation and demodulation of a digital signal (also described in the remainder of this document as a digital radio modem) is proposed, according to a first aspect of the technique described. This digital radio modem is configured to operate using a preselected radio access technology, for example LoRa™, Sigfox™ or WM-Bus technology, all of which technologies are particularly appropriate for the deployment of wireless sensor networks. The modem comprises a frame, which protects the electronics required for its operation, and thus constitutes an independent physical block. A plurality of communication interfaces are arranged within said frame, thus permitting the very simple connection or disconnection of the digital radio modem to or from the remainder of a system. Here, and in the remainder of the document, the term "communication interfaces" is understood to include interfaces of a physical type which are employed for the mutual physical interconnection of a plurality of electronic devices. These communication interfaces can, for example, assume the form of serial connectors (such as SPI (serial peripheral interface) connectors) which permit the constitution of a common data bus which is shared between all the devices thus interconnected.

In a particular form of embodiment of the proposed technique, the digital radio modem comprises at least a first communication interface with a complementary device, and at least a second communication interface with an analog radio interface module.

The first communication interface present on the digital radio modem permits the connection thereof to a complementary device, which may be a device of the same type (namely, another digital radio modem according to the proposed technique), or a device of another type (for example a control device, an electric power supply device, or a device for the management of another type of interface—for example Ethernet, WiFi, or 3G/4G—with another network). In the first case, the digital radio modems are mutually connected by the cooperation of the first communication interfaces which are respectively present on each of said devices. In the second case, the complementary device to which the digital radio modem is connected is a "compatible" device, in that the device itself comprises at least one communication interface which permits the cooperation thereof with a first communication interface on the digital radio modem according to the proposed technique. These communication interfaces can, for example, assume the form of SPI connectors, and thus contribute to the constitution of a common data bus which is shared by the devices, once the latter are connected.

The second communication interface present on the digital radio modem permits the connection thereof to a compatible analog radio interface module, as described hereinafter in the present document. In this manner, it is possible to constitute a radio interface device which, by the simple addition of one or more antennae, permits the reception and transmission of data from or to at least one remote wireless sensor. By way of an example, this second communication interface can also assume the form of an SPI connector.

In a particular form of embodiment of the proposed technique, the digital radio modem comprises at least two first communication interfaces with a complementary device, thus permitting the communication thereof with at least two complementary devices. These communication interfaces are respectively situated at the termination of at least one data bus, thus permitting said digital radio modem to exchange data with the complementary devices. In this manner, a single digital radio modem can be connected to a plurality of complementary devices, which can be other devices of the same type (i.e. other digital radio modems according to the proposed technique) or other compatible devices. It is thus possible to constitute a string of multiple devices, such that the latter all share at least one common data bus (for example, an SPI bus), thus permitting the mutual exchange of data between all the devices thus interconnected. Preferably, the "compatible" complementary devices (other than digital radio modems) also comprise at least two communication interfaces which are designed to cooperate with the first communication interfaces of a digital radio modem according to the proposed technique, such that it is possible to interconnect the various devices in any order.

In another particular form of embodiment of the proposed technique, the radio access technology deployed in the digital radio modem can be selected, in terms of software, from a group of predefined radio access technologies (i.e. pre-parameterized, pre-registered or accessible) in said digital radio modem. The digital radio modem thus incorporates sufficient on-board electronics for the management of a number of types of digital modulation and demodulation; in software terms, it is possible to configure the type thereof which is to be employed. In this manner, a single digital radio modem can accommodate different radio access technologies, and can thus be employed differently in different contexts. This may also permit the optimization of production costs for these devices.

5.4. Analog Radio Interface Module

According to a further aspect, the proposed technique also relates to an analog radio interface module. This module—which serves as the front-end analog system for adaptation to the frequency band employed for radio transmission—is designed for use in conjunction with at least one digital radio modem according to the proposed technique. It comprises a frame, which incorporates the requisite electronics for its operation, and thus constitutes an independent physical block. It also comprises, arranged within said frame, connection means to at least one antenna, and at least one third communication interface with a digital radio modem, of the type described above.

The function of this analog radio interface module is the management of adaptation to the frequency band employed for radio transmission, and to provide the necessary connectivity for the accommodation of different types of antennae (omnidirectional, polarized or sectorized). Moreover, depending upon the different particular forms of embodiment of an analog radio interface module according to the proposed technique, the frequency band accommodated by this module, the number of third communication interfaces and the type of connection means to the at least one available antenna may vary. The proposed technique thus provides access to an extensive range of analog interface modules, configured in the form of independent physical blocks, which can cooperate with one or more digital radio modems, in order to permit the coverage of any type of situation, in terms of both frequency bands and the type of antennae to be employed.

5.5. Radio Interface Device

According to a further aspect, the proposed technique also relates to a radio interface device for the reception and transmission of data from and to at least one wireless sensor. A radio interface device of this type comprises the following:

at least one digital radio modem according to the proposed technique;
an analog radio interface module according to the proposed technique.

The analog radio interface module is connected to said at least one digital radio modem by means of the cooperation of said second and third communication interfaces.

It is thus possible to constitute a radio interface device by the combination of at least one digital radio modem with an analog radio interface module according to the proposed technique. The fact that each of these elements has a dedicated frame, incorporating complementary communication interfaces, permits the achievement of a highly modular solution. A straightforward adaptation to a large number of situations is thus possible, by the simple selection of physical blocks to be combined, namely, the selection of a digital radio modem and the selection of an analog radio interface module to be combined. Selection of the digital radio modem thus permits the definition of the radio access technology to be employed (depending upon the functionalities provided by this digital radio modem, a simple software configuration may be sufficient). Selection of the analog radio interface module permits the definition, firstly of the frequency band which is to be employed for radio transmission, and secondly of the type of antennae configuration to be employed (sectorized, polarized or omnidirectional antenna, etc.).

In a particular form of embodiment of the proposed technique, the radio interface device comprises a plurality of digital radio modems according to the technique described. In this case, these digital radio modems are all of the same type (employing the same radio access technology), and are mutually connected by means of their first communication interfaces. It is therefore straightforward to undertake the constitution or scaling of a radio interface device, such that it is consistently dimensioned to respond to an expansion in the number of wireless sensors to be managed within a given territory, which is covered by the same antenna. In practice, the proposed technique permits the simple mutual connection of a plurality of digital radio modems, and the association of the unit thus formed with a single analog radio interface module. In this manner, it is possible to increase the load capacity of a radio interface device, by the simple addition of a supplementary digital radio modem to an existing installation.

5.6. Gateway for Wireless Sensor Networks

The proposed technique also relates to a gateway for wireless sensor networks. This gateway specifically permits the interconnection of at least one wireless sensor network with at least one other wide-area communication network and, to this end, comprises at least one radio interface device of the type described above, for the exchange of data with said wireless sensors, and at least one complementary interface device with a wide-area communication network. The complementary device is a compatible device of the type already introduced in the present document, and thus comprises at least one communication interface for the connection thereof to a first available communication interface on a digital radio modem which is incorporated in the radio interface device. Other types of complementary devices, which are likewise provided with compatible communication interfaces, can also be integrated in the gateway: by way of an example, reference may be made to a complementary device for the delivery of an electric power supply to the entire gateway, or a complementary control device for the monitoring of the operation of all the other complementary devices and radio interface devices included in the gateway, and for the control of data exchanges executed between all these different elements.

In a particular form of embodiment, a single gateway according to the proposed technique can comprise a plurality of radio interface devices, which are mutually connected by means of the cooperation of the first communication interfaces available within digital radio modems which are incorporated in each radio interface device. In this manner, it is possible, for example, to combine radio interface devices based upon heterogeneous radio access technologies in a single gateway. This flexibility of connection also permits the constitution of a gateway which is capable of managing different frequency bands. This also permits the deployment of sectorization, for example, in the interests of superior territorial coverage. Naturally, all these examples are provided exclusively by way of illustration, and not by way of limitation, and a person skilled in the art will be aware of the multiple configuration options provided by a gateway which is constituted according to the proposed technique.

5.7. Description of a Particular Form of Embodiment of the Proposed Technique

With reference to the series of FIGS. 2 to 5, an exemplary implementation of the proposed technique is described, which permits the achievement of the objective of a modular and scalable gateway which is capable of providing a response to the issues raised by the deployment of large-scale wireless sensor networks.

5.7.1 Digital Radio Modem

Figure 2A:
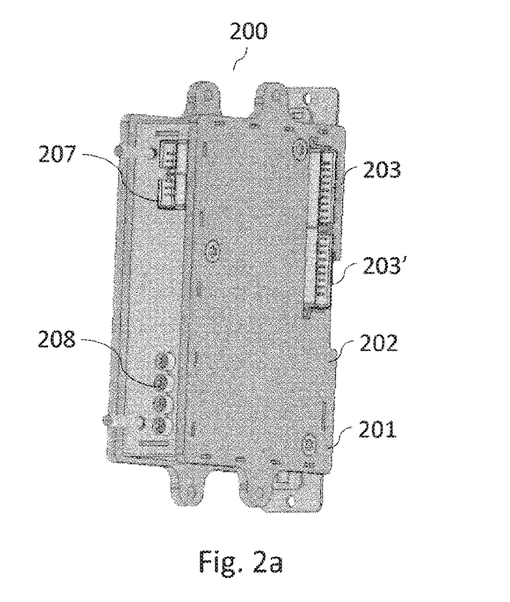
FIGS. 2a and 2b show different views of a digital radio modem, in a particular form of embodiment of the proposed technique.
Figure 2B:
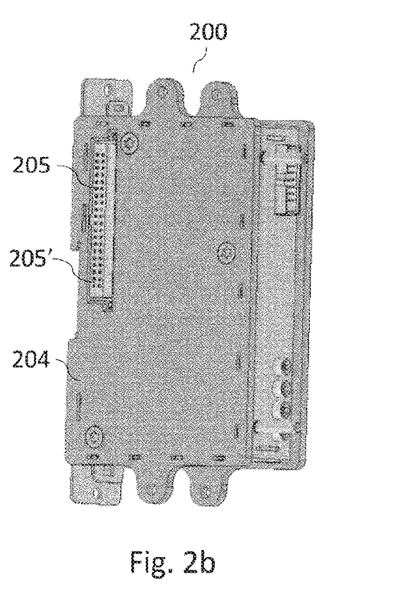

With reference to FIGS. 2a and 2b, different views are presented of a digital radio modem (200) according to a particular form of embodiment of the proposed technique. In this example, which is provided exclusively by way of illustration and not by way of limitation, this digital radio modem (200) incorporates a protective frame (201) of an overall parallelepipedic design, comprising the following:

on one of its surfaces, described as the "upper surface" (202), two male SPI connectors (203, 203');

on the opposing surface to said upper surface, described as the "lower surface" (204), two female SPI connectors (205, 205'), which are designed to cooperate with the two male SPI connectors (203, 203') of another digital radio modem according to the form of embodiment described, when these devices are connected.

The male SPI connectors (203, 203') and female SPI connectors (205, 205') form the respective terminations of at least one SPI (serial peripheral interface) data bus, arranged internally to the frame, which is employed by the digital radio modem for the transmission and reception of data to and from other complementary devices (which may specifically be other digital radio modems according to the particular form of embodiment described herein).

The frame moreover comprises, on one of its lateral surfaces, described as the "rear surface" (206), at least one further SPI connector (207) and at least one coaxial connector (208). These connectors are designed to cooperate with complementary connectors which are present on an analog radio interface module, as described hereinafter.

5.7.2 Analog Radio Interface Module

With reference to FIGS. 3a to 3d, we will now present two examples of analog radio interface modules which are designed to cooperate with one or more digital radio modems according to the particular form of embodiment described.

Figure 3A:
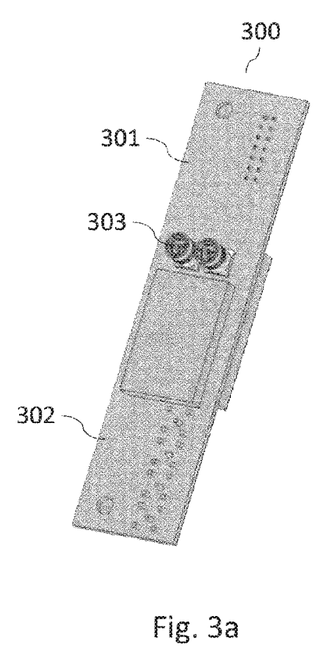
FIGS. 3a and 3b show different views of an analog radio interface module, in a particular form of embodiment of the proposed technique.
Figure 3B:
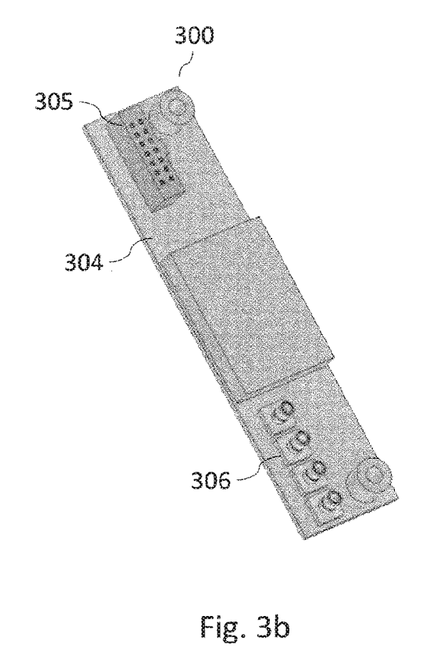

FIGS. 3a and 3b illustrate different views of a first example of an analog radio interface module (300) which is designed to cooperate with a digital radio modem, according to a particular form of embodiment of the proposed technique. In this example, which is provided exclusively by way of illustration and not by way of limitation, this module (300) incorporates a protective frame (301) of generally parallelepipedic design, and comprises the following:

on one of its surfaces, described as the "rear surface" (302), at least one coaxial connector (303) which is designed for the connection of at least one antenna.

on the opposing surface to said rear surface, described as the "front surface" (304), at least one SPI connector (305) and at least one coaxial connector (306), wherein these connectors (305, 306) are designed to cooperate respectively with the respective complementary connectors which are present on the rear surface of a digital radio modem of the type described above.

This analog radio interface module (300) is dimensioned and configured such that, once connected to the digital radio modem according to the particular form of embodiment illustrated here, the unit formed by these two elements constitutes a consolidated block of overall parallelepipedic shape. To this end, the front surface (304) of the analog radio interface module is of substantially equivalent dimensions to the rear surface of the digital radio modem.

Figure 3C:
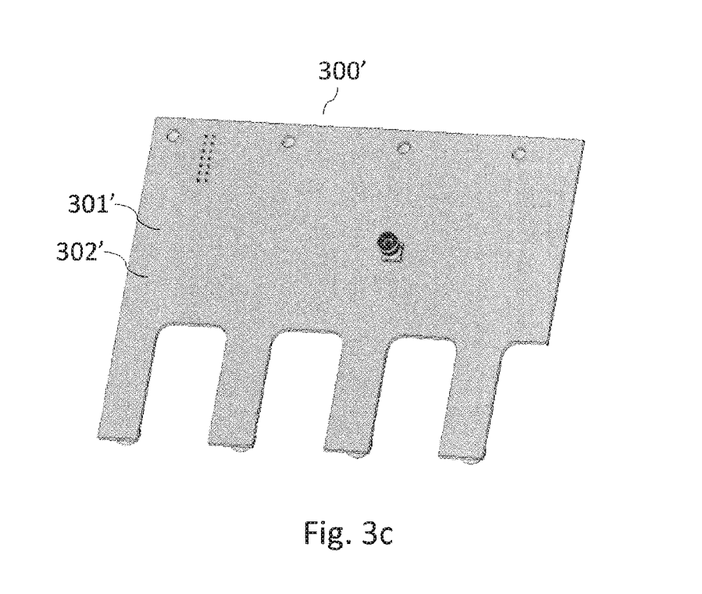
FIGS. 3c and 3d show different views of an analog radio interface module, in another particular form of embodiment of the proposed technique.
Figure 3D:
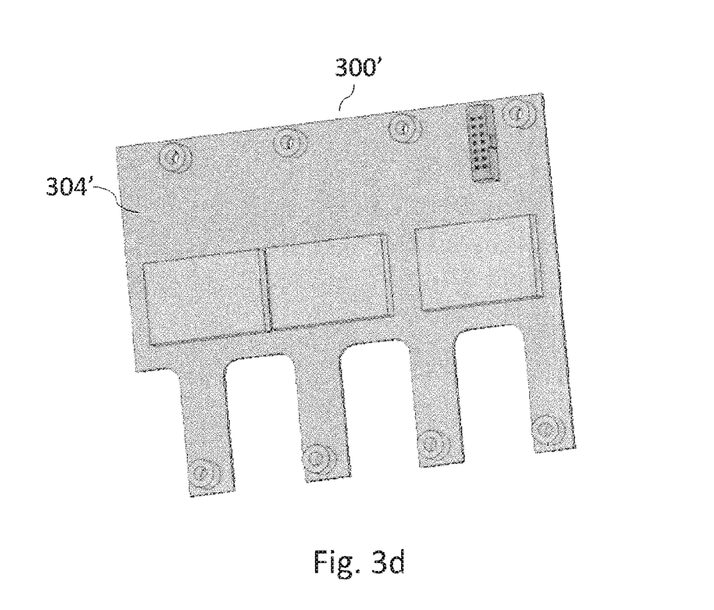

With reference to FIGS. 3c and 3d, a further example is presented of an analog radio interface module which is appropriate for use in the context of the particular form of embodiment of the proposed technique described here. In this particular form of embodiment, the analog radio interface module (300') is designed to cooperate, no longer with a single digital radio modem, but with a plurality of digital radio modems (four, in the example illustrated). The protective frame (301') of this module is of an overall parallelepipedic shape, and its front surface (304') is of substantially equivalent dimensions to the four rear surfaces of the digital radio modems arranged side by side. This module is dimensioned and configured such that, once connected to a block of four digital radio modems, the unit formed by all these elements constitutes a consolidated block of overall parallelepipedic shape. The analog radio interface module incorporates, on its rear surface, at least one coaxial connector, which is designed for the connection of at least one antenna and, on its front surface, at least one connector which is designed to cooperate with at least one respective complementary connector which is present on the rear surface of at least one of the digital radio modems to which said module is connected.

These examples are provided exclusively by way of illustration and not by way of limitation, and other types of analog radio interface modules, which are configured and dimensioned for connection to a different number of digital radio modems, may also be deployed in the context of the proposed technique (for example, an analog radio interface module which cooperates with two interconnected digital radio modems, or an analog radio interface module which cooperates with four interconnected digital radio modems). In the interests of simplification, an "analog radio interface module of dimension N" is defined as an analog radio interface module which is specially designed for the simultaneous connection to a number N of interconnected digital radio modems. In a particular form of embodiment of the proposed technique, the frame of an analog radio interface module of dimension N is dimensioned and configured such that its front surface is of dimensions which are substantially equivalent to those of N rear surfaces of digital radio modems arranged side by side. This permits the retention of the overall parallelepipedic shape of radio interface devices, even when a single analog radio interface module is connected to a plurality of digital radio modems.

5.7.3 Radio Interface Device

Figure 4A:
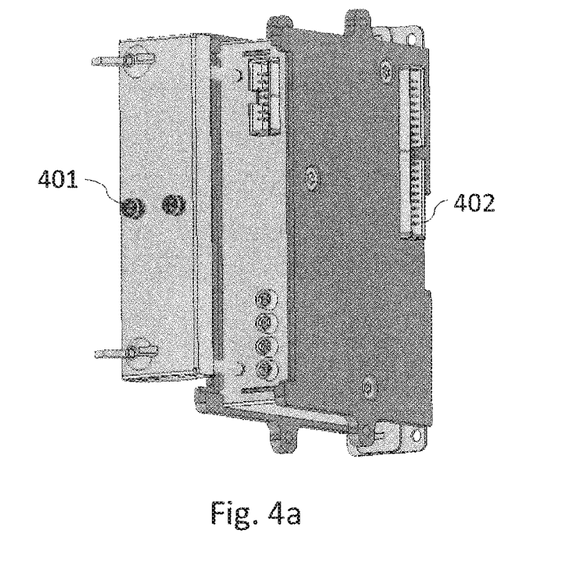
FIG. 4a illustrates an example of the fitting in progress of an analog radio interface module to a digital radio modem, thus constituting a radio interface device, according to a particular form of embodiment of the proposed technique.
Figure 4B:
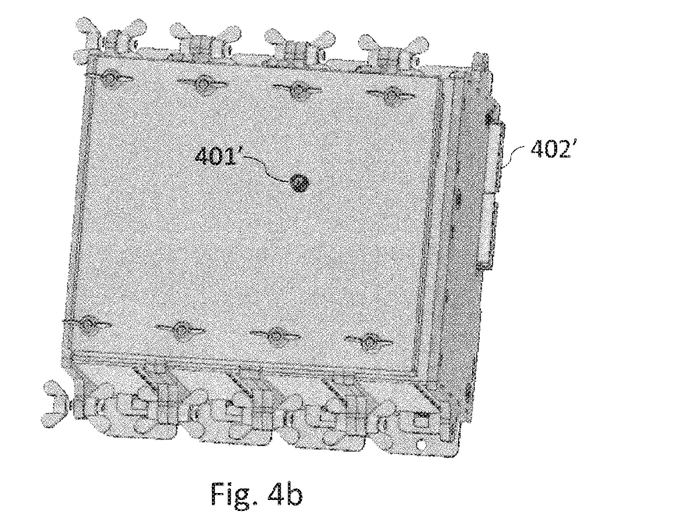
FIG. 4b illustrates an example of the fitting of an analog radio interface module to a block of a plurality of interconnected digital radio modems, thus constituting a radio interface device, according to another particular form of embodiment of the proposed technique.

FIGS. 4a and 4b illustrate two examples of assemblies of an analog radio interface module with at least one digital radio modem according to the proposed technique, in order to constitute a radio interface device for the reception and transmission of data from and to at least one wireless sensor. FIG. 4a thus represents the connection of an analog radio interface module of dimension one to a single digital radio modem. FIG. 4b represents the connection of an analog radio interface module of dimension three to a block comprising three digital radio modems which are interconnected by means of male and female SPI connectors which are present on their upper and lower surfaces. In the case of the connection of a single analog radio interface module to a plurality of interconnected digital radio modems, as illustrated in FIG. 4b, these various digital radio modems are all of the same type, i.e. they employ a single radio access technology. The remaining available coaxial connectors on the rear surface of the analog radio interface module are employed for the connection of at least one antenna. The remaining available SPI connectors (402, 402') on either side of the radio interface device thus constituted are employed for the connection of this radio interface device to other radio interface devices, or to other compatible complementary devices (such as control devices, or interface devices to other networks, for example to the Internet).

A radio interface device thus constituted can therefore accommodate a given radio access technology in a given frequency band. It is also possible to describe this device by a dimension, corresponding to its constituent number of digital radio modems (analogously to the definition applied in conjunction with the analog radio interface module). Thus, in the context of the present document, a LoRa™ 868 MHz radio interface device of dimension 3 is a radio interface device constituted by the combination of three digital radio modems employing LoRa™ radio access technology, associated with a single analog radio interface module operating in the 868 MHz frequency band. The dimension is an indicator of the load (in terms of the number of wireless sensors) which a radio interface device is capable of managing.

5.7.4 Examples of Gateway Configurations

Figure 5A:
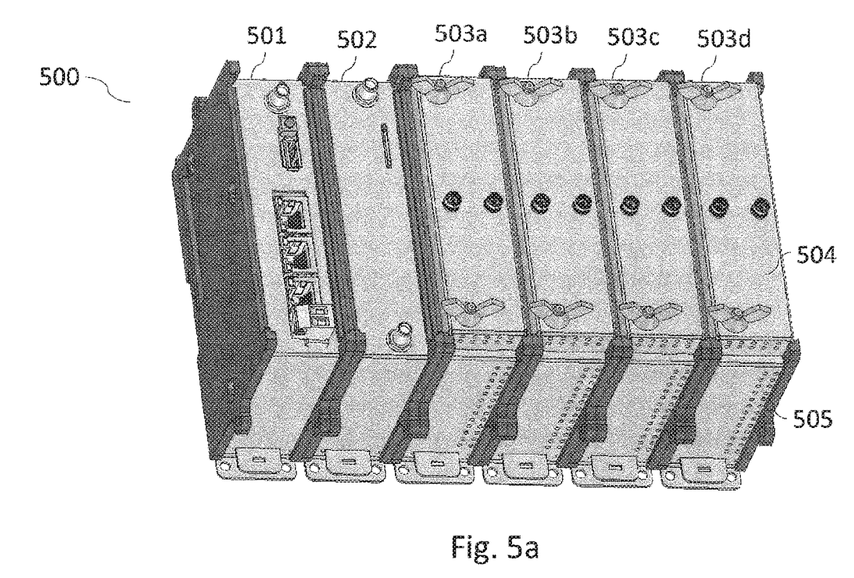
FIGS. 5a to 5c show different examples of gateways for the deployment of a wireless sensor network, obtained by the combination of digital radio modems, complementary devices and analog radio interface modules according to the proposed technique, in a particular form of embodiment.
Figure 5B:
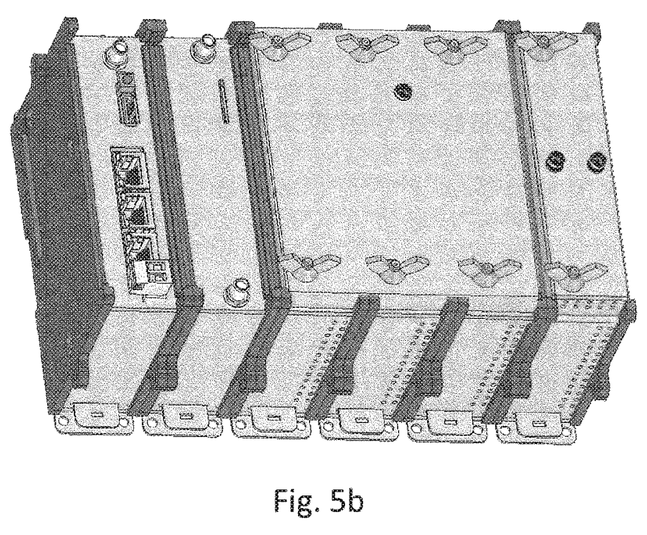
Figure 5C:
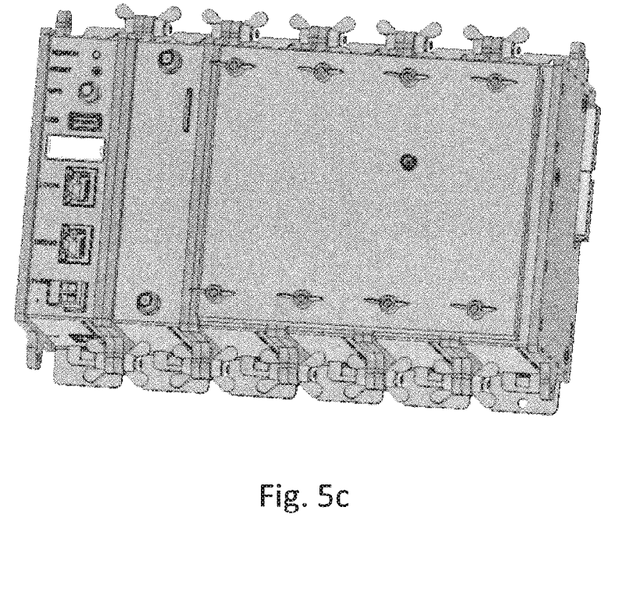

With reference to FIGS. 5a to 5c, various gateway configurations are presented, provided exclusively by way of illustration and not by way of limitation, which can be deployed in a highly simple manner using the proposed technique.

These configurations involve other complementary devices, in addition to digital radio modems and their associated analog radio interface modules. These may be mandatory or optional complementary devices for the constitution of a gateway architecture. Thus, in one particular form of embodiment represented by the example associated with FIG. 5a, a gateway (500) according to the proposed technique comprises a complementary control device (501) which is designed, firstly to deliver the electric power supply to the entire gateway, wherein this device is connected, for example, to a conventional electric power socket, or is supplied directly via an Ethernet cable using PoE (Power over Ethernet) technology, and secondly to control all the other complementary devices and radio interface devices. Complementary interface devices (502), permitting different types of interconnection (Ethernet, WiFi, 3G/4G, etc.) with other local or wide-area networks, can also be deployed. In the particular form of embodiment described here, each of these complementary devices comprises a protective frame of dimensions which are substantially equivalent to those of a digital radio modem according to the proposed technique. In common with the frames of digital radio modems, these frames respectively comprise, on their upper and lower surfaces, at least one male SPI connector and at least one female SPI connector, which are designed to cooperate with the SPI connectors on another device, where these devices are combined. These male and female SPI connectors form the respective terminations of at least one data bus, which is arranged internally to the frame. Thus, the cooperation of the various SPI connectors, when a plurality of devices are mutually combined, permits all the devices thus interconnected to communicate with each other by means of the common communication bus thus established.

FIG. 5a shows an example of a gateway comprising four radio interface devices (503a, 503b, 503c, 503d) for the reception and transmission of data from and to wireless sensors, wherein each of these radio interface devices comprises a single digital radio modem, each associated with a single analog radio interface module. The radio interface device (503d) is constituted, for example, by the combination of the digital radio modem (505) with the analog radio interface module (504). A configuration of this type can comprise, for example, three radio interface devices accommodating the LoRa radio access technology in the 868 MHz frequency band, each of which is associated with a sectorized antenna (tri-sectorization), and a radio interface device for the accommodation of WM-Bus radio access technology in the 169 MHz frequency band, associated with an omnidirectional antenna. In this manner, the gateway thus constituted is capable of accommodating two types of radio access technologies, one (LoRa™) for communication with connected objects, and the other (WM-Bus) for communication with electricity or gas meters, e.g. for the execution of remote readings. If LoRa™ technology is to be operated in another frequency band, for example in the event of the transposition of an existing solution to a territory in which different radio communication regulations are in force, the gateway can be very easily adapted to this new situation, simply by replacing the three analog radio interface modules which are configured for the 868 MHz band with three others which are configured for the desired frequency band, for example the 915 MHz band. If, in another example, LoRa™ technology is to be operated in the 433 MHz frequency band and, for any reason, it is preferred that a single omnidirectional antenna should be employed rather than three sectorized antennae, the three analog radio interface modules which are configured for the 868 MHz band can be very simply replaced by a single analog radio interface module of dimension three, configured for the 433 MHz band. This gateway configuration is illustrated in FIG. 5b, which shows an example of a gateway comprising two radio interface devices for the reception and transmission of data from and to wireless sensors: a first radio interface device comprising three digital radio modems associated with the same analog radio interface module, and a second radio interface device, wherein this radio interface device comprises a single digital radio modem associated with a single analog radio interface module.

Finally, FIG. 5c shows an example of a gateway comprising a single radio interface device for the reception and transmission of data from and to wireless sensors, wherein this radio interface device itself comprises four digital radio modems associated with a single analog radio interface module. This radio interface device is associated, for example, with an omnidirectional antenna. In this case, the gateway manages only a single radio access technology, but the multiplicity of digital radio modems is such that it is capable of managing a large number of sensors.

It should observed that, while the gateways presented in FIGS. 5a to 5c all comprise four digital radio modems (divided between a variable number of radio interface devices), these are only examples provided exclusively by way of illustration and not by way of limitation: a gateway according to the proposed technique comprises one or more digital radio modems and one or more analog radio interface modules, wherein one digital radio modem is always coupled to a single analog radio interface module, but a single analog radio interface module can be associated with a number of digital radio modems.

In consideration of these examples, a person skilled in the art will easily appreciate the potential offered by the proposed technique, in terms of both modularity and scalability. The possibility of the very straightforward combination of digital radio modems with an analog radio interface module to constitute a radio interface device, added to the possibility of the combination of a plurality of radio interface devices thus constituted within the same gateway, offer an elegant solution to the various potential issues arising in conjunction with the deployment or maintenance of large-scale wireless sensor networks. This modular gateway architecture can accommodate the diversity of radio access technologies, both existing and forthcoming, together with the diversity of frequencies employed for radio transmission, different types of antennae and adaptation to the number of sensors to be addressed.

By way of examples, the instances of application set out below demonstrate the potential responses delivered by the proposed technique to various situations which may arise in conjunction with the deployment of large-scale sensor networks:

The requirement for the simultaneous accommodation of a plurality of wireless sensor networks based upon different protocols (for example, a LoRa™ network and a WM-Bus network): using the proposed technique, a multi-technology radio access carrier medium can easily be achieved by the simple combination of at least one radio interface device which is adapted to each radio access technology to be accommodated (for example, the combination within the gateway of a radio interface device comprising one or more LoRa™ digital radio modems, and a radio interface device comprising one or more WM-Bus digital radio modems).

The requirement for the management of multiple frequency bands for radio transmission, using the same radio access technology (for example, the simultaneous accommodation of LoRa™ technology in the 433 MHz and 868 MHz bands): using the proposed technique, the accommodation of multiple bands is easily achieved by the combination of at least one radio interface device which is adapted to each frequency band to be managed (for example, by the combination within the gateway of a LoRa™ radio interface device comprising a 433 MHz analog radio interface module, and a LoRa™ radio interface device comprising a 868 MHz analog radio interface module).

The requirement for the transition from an omnidirectional antenna to a tri-sectorized three-antenna configuration (and vice versa): using the proposed technique, sectorization can be deployed simply, by the combination of a radio interface device of the same type (employing the same radio access technology and the same frequency band) for each sector to be covered, wherein each of these radio interface devices is connected to a dedicated sectorized antenna (for example, a combination of three Sigfox 915 MHz radio interface devices of dimension one). Conversely, the transition from a tri-sectorized configuration to a single-antenna configuration (omnidirectional antenna) can also be executed very simply, for example by replacing the analog radio interface modules of dimension one associated with the radio interface device for each sector with a single analog radio interface module of dimension three, to which the omnidirectional antenna will be connected (thus switching, for example, from a configuration with three Sigfox 915 MHz radio interface devices of dimension one to a configuration with a single Sigfox 915 MHz radio interface device of dimension three).

The requirement for the modification of the load (in terms of the number of sensors) which can be accommodated by a radio interface device: using the proposed technique, an adjustment of capacity can be deployed simply by replacing the targeted radio interface device with a radio interface device of the same type (employing the same radio access technology and the same frequency band), but of smaller dimensions (if fewer sensors are to be managed) or larger dimensions (if more sensors are to be managed).

The requirement for the management of a new type of connection to another wide-area network (for example, the management of a WiFi link): using the proposed technique, the scalability of options for the connectivity of a gateway can be easily achieved, by the simple addition or replacement of a compatible complementary device.

These examples are provided exclusively by way of illustration and not by way of limitation, and it will be clearly apparent to a person skilled in the art that the proposed technique can provide an appropriate response to numerous situations, including complex situations in which it is necessary to undertake the simultaneous adaptation of multiple parameters (modification of the radio access technology, concomitantly with a modification of the frequency band and the type of antennae to be employed, and a modification of the number of sensors to be managed, for example).

5.7.5. Further Characteristics and Advantages

Further significant characteristics are described here, with reference to the gateway architecture presented according to the particular form of embodiment illustrated by FIGS. 2 to 5.

It may be interesting to note, for example, that no external cable is necessary for the connection of the various constituent physical blocks of the gateway (digital radio modems, associated analog radio interface modules, complementary devices): the frames of these various devices are configured and dimensioned to permit the assembly thereof by the interlocking of the various respective complementary connectors which are present on their various surfaces, wherein the final assembly assumes a compact and overall parallelepipedic form, which simplifies its installation and integration in any type of environment.

The various frames deployed also incorporate, in certain particular forms of embodiment, characteristics which are intended to ensure the effective mutual attachment of the constituent blocks of a gateway according to the proposed technique, specifically for the prevention of any unintentional disconnection of these blocks.

Accordingly, digital radio modems and analog radio interface modules are provided with complementary means of attachment. For example, the frame of a digital radio modem may incorporate one or more threaded holes, which are designed to accommodate complementary wing screws which pass through the frame of an associated analog radio interface module.

Digital radio modems also incorporate means which contribute to their mutual attachment, or the attachment thereof to complementary devices. These means can assume, for example, the form of a protrusion on the frame of said devices, in which a hole is formed, such that all the holes thus constituted are mutually aligned, once the various constituent devices of the gateway are interlocked. These holes may then permit the passage of various means of attachment (threaded rods and fixings, collars, etc.).

The frames of digital radio modems and complementary devices incorporate means for the attachment of a gateway for wireless sensor networks constituted according to the proposed technique in a cabinet or in a conventional protective bay.

In a particular form of embodiment of the proposed technique, the frame of the different constituent physical blocks of the gateway, and specifically the frame of the analog radio interface modules, is moreover designed to function as a Faraday cage, in order to protect these modules from any electromagnetic disturbances to which they may be exposed. In another form of embodiment, a plate which functions as a protective shield, and which assumes this function of a Faraday cage, can be secured as a cover for the analog radio interface modules.

The invention claimed is:

1. A digital radio modem (200) for the modulation and demodulation of a digital signal, in accordance with a preselected radio access technology, wherein said digital radio modem is characterized in that it comprises a protective frame (201) of overall parallelepipedic design and a plurality of communication interfaces which are arranged within said protective frame (201),
wherein the plurality of communication interfaces comprises:
at least two first communication interfaces with a complementary device,
wherein one of the first communication interfaces comprises:
on one of the surfaces of the protective frame (201), described as the "upper surface" (202), two male SPI connectors (203, 203');
wherein another of the first communication interfaces comprises:
on the opposing surface of the protective frame (201) to said upper surface (202), described as the "lower surface" (204), two female SPI connectors (205, 205'), which are designed to cooperate with the two male SPI connectors (203, 203') of another digital radio modem such that, when a plurality of digital radio modems are connected: the male (203, 203') and female (205, 205') SPI connectors constitute the respective terminations of at least one SPI data bus, arranged internally to the protective frame (201), and employed by the digital radio modem for the transmission and reception of data to and from the digital radio modem(s) to which it is connected;
at least one second communication interface with an analog radio interface module, wherein the second communication interface comprises:
on one of the lateral surfaces of the protective frame (201), described as the "rear surface" (206), at least one other SPI connector (207) and at least one coaxial connector (208), which are designed to cooperate with the complementary connectors present on an analog radio interface module.

2. The digital radio modem as claimed in claim 1, characterized in that said preselected radio access technology is selected from a series of predefined radio access technologies within said digital radio modem.

3. The digital radio modem as claimed in claim 1, having complementary means of attachment to the means of attachment of said analog radio interface module.

4. The digital radio modem as claimed in claim 1, wherein the protective frame (201) of the digital radio modem incorporates one or more threaded holes, which are designed to accommodate complementary wing screws which pass through the protective frame (201) of said associated analog radio interface module.

5. The digital radio modem as claimed in claim 1, wherein the digital radio modem incorporates means which contribute to the attachment thereof to other digital radio modems, or to complementary devices.

6. The digital radio modem as claimed in claim 1, wherein the means which contribute to the attachment of the digital radio modem to other digital radio modems or to complementary devices comprise a protrusion on the protective frame (201) of the digital radio modem, in which a hole is formed, such that the hole thus formed is aligned with the holes formed in said other digital radio modems or in said complementary devices, once the various devices are interlocked.

7. An analog radio interface module (300), characterized in that it comprises a protective frame (301) of overall parallelepipedic design, connection means to at least one antenna, and at least one third communication interface with a digital radio modem as claimed in claim 1, wherein said connection means to the at least one antenna and said at least one third communication interface are arranged within said protective frame (301),
wherein the connection means to the at least one antenna comprise:
on one of the surfaces of the protective frame (301), described as the "rear surface" (302), at least one coaxial connector (303), which is designed for the connection of the at least one antenna,
wherein the third communication interface with a digital radio modem comprises:
on an opposing surface of the protective frame (301) to said rear surface, described as the "front surface" (304), at least one SPI connector (305) and at least one coaxial connector (306), wherein these connectors (305, 306) are designed to cooperate respectively with the respective complementary connectors which are arranged on a rear surface of a digital radio modem,
wherein the protective frame (301) of the analog radio interface module is dimensioned and configured such that the front surface thereof is of substantially equivalent dimensions to the N rear surfaces of digital radio modems which are designed to be arranged side by side, where N is a whole number greater than or equal to 1.

8. The analog radio interface module (300) as claimed in claim 7, configured for connection to a digital radio modem, wherein the front surface (304) of the protective frame (301) of the analog radio interface module is of substantially equivalent dimensions to the rear surface of said digital radio modem.

9. The analog radio interface module (300) as claimed in claim 7, configured for simultaneous connection to a number N of digital radio modems, wherein the digital radio modems are designed to be arranged side by side and interconnected, wherein the front surface (304) of the protective frame (301) of the analog radio interface module is of substantially equivalent dimensions to the N rear surfaces of said digital radio modems.

10. The analog radio interface module (300) as claimed in claim 7, wherein the protective frame (301) of the analog radio interface module is designed such that it functions as a Faraday cage.

11. A radio interface device for the reception and transmission of data from and to at least one wireless sensor, wherein said device is characterized in that it comprises:
  at least one digital radio modem as claimed in claim 1;
  an analog radio interface module, connected to said at least one digital radio modem by means of the cooperation of said second and third communication interfaces.

12. The radio interface device as claimed in claim 11, characterized in that it comprises a plurality of digital radio modems, associated with a single radio access technology, wherein said digital radio modems of said plurality of digital radio modems are mutually connected by means of said first communication interfaces.

13. A gateway (500) for the interconnection of at least one wireless sensor network with at least one wide-area communication network, wherein said gateway is characterized in that it comprises:
  at least one radio interface device as claimed in claim 11, for the exchange of data with said wireless sensors;
  at least one complementary interface device (502) with said at least one wide-area communication network, wherein said complementary interface device (502) comprises at least one fourth communication interface, wherein said complementary interface device (502) is connected to said at least one radio interface device by means of the cooperation of said fourth communication interface with a first communication interface of a digital radio modem of said radio interface device, wherein the complementary interface device (502) comprises a protective frame of substantially equivalent dimensions to a protective frame (201) of a digital radio modem,
wherein the fourth communication interface comprises, on an upper and lower surface of the protective frame of the complementary interface device (502), at least one male SPI connector and at least one female SPI connector, which are designed to cooperate with the SPI connectors of a digital radio modem or of another complementary interface device (502), wherein the male and female SPI connectors constitute the respective terminations of at least one data bus which is arranged internally to the frame.

14. The gateway as claimed in claim 13, characterized in that it comprises a plurality of radio interface devices, wherein said radio interface devices of said plurality of radio interface devices are mutually connected by means of the cooperation of the first communication interfaces of the digital radio modems of said plurality of radio interface devices.

15. The gateway as claimed in claim 13, wherein the protective frame of the digital radio modems and the complementary devices comprises means for the attachment of the gateway for wireless sensor networks in a cabinet or in a protective bay.

* * * * *